United States Patent [19]

Thorn et al.

[11] 3,997,380
[45] Dec. 14, 1976

[54] METHOD OF ENGRAVING A CONDUCTIVE LAYER

[75] Inventors: Yves H. Thorn, La Celle Saint-Cloud; Michel Sineau, Sartrouville, both of France

[73] Assignee: Compagnie Internationale pour l'Informatique, Louveciennes, France

[22] Filed: Feb. 12, 1973

[21] Appl. No.: 331,542

Related U.S. Application Data

[63] Continuation of Ser. No. 124,067, March 15, 1971, abandoned.

[30] Foreign Application Priority Data

Apr. 17, 1970 France .................. 70.13995

[52] U.S. Cl. .................... 156/3; 156/11; 156/18; 427/96; 427/99
[51] Int. Cl.² .................. B05D 5/12; H01L 21/312
[58] Field of Search .............. 156/3, 7, 11, 17, 18, 156/10; 117/107; 427/96

[56] References Cited
UNITED STATES PATENTS

| | | | |
|---|---|---|---|
| 3,556,951 | 1/1971 | Cerniglia et al. | 156/17 |
| 3,645,785 | 2/1972 | Hentzschel | 117/107 |
| 3,695,955 | 10/1972 | Jochems et al. | 156/13 |

FOREIGN PATENTS OR APPLICATIONS 1,181,380   2/1970   United Kingdom ............... 156/11

OTHER PUBLICATIONS

*Chemical Engineer's Handbook;* John Perry; McGraw–Hill Book Company, 2nd Ed., pp. 2728–2733.

*Primary Examiner*—William A. Powell
*Assistant Examiner*—Jerome W. Massie
*Attorney, Agent, or Firm*—Kemon, Palmer & Estabrook

[57] ABSTRACT

For avoiding the formation of sharp edges and lateral depressions in the conductors engraved from a conductive layer coated over an insulating surface, a thin film of a conductive material other than the conductive material of the layer is first coated over the said layer. After deposition of a mask of resist over said film, two successive engraving operations are made, the first one with a first acid solution inactive with respect to the material of the layer, the second one with a second acid solution inactive with respect to the material of the film.

2 Claims, 7 Drawing Figures

METHOD OF ENGRAVING A CONDUCTIVE LAYER

This is a continuation of application Ser. No. 124,067, filed Mar. 15, 1971, now abandoned.

THE PRIOR ART

When a conductive layer of any material coated over an insulating surface is engraved with a conventional method having recourse to a chemical attack by an acid solution of parts of said conductive layer unprotected by a resist, the result is such as shown in FIG. 1: any edge of a conductor 2 is steep and presents a sharp ridge; it further present a lateral depression with respect to the resist 3, depression which may be qualified by the ratio $d/e$, where d is the dimension of the jutting part of the resist and e is the thickness of the engraved conductor 2 from the surface of the insulating member 1. This ratio depends of the nature of the engraving acid solution, of the adherence of the resist on the conductive material and of the nature of the material of said conductive layer proper.

When, in a further operation, a dielectrical layer 4 is coated over the product of FIG. 1, the result is such as shown in FIG. 2: the dielectric layer presents two points of weakness, A and B. Point A corresponds to a localized thinness produced at the deposition of the dielectric material and due to the depressed and steep shape of the edge of the conductor, and point B corresponds to the sharp ridge of said conductor edge. Weakness point A may entail risks of fracture of the dielectric layer. Weakness point A is due to mechanical conditions, (i.e. a stress localization at such a point) and may further entail electrical defaults (important localization of the electric field due to the point effect of the sharp ridge). When further another conductive layer is coated over the dielectric layer 4, as shown at 5 in FIG. 3, said second conductive layer presents at C a localized thinness producing an electrical weakness at this location of the layer.

The presence of such points of weakness is already a drawback for a two layer circuit and becomes deleterious when such an alternative formation of conductive and dielectric layers is continued for making a multi-layer circuit as the defects will be reproduced and enhance at each engraving of a further conductive layer in such a multi-layer circuit.

BRIEF SUMMARY OF THE INVENTION

It is the object of the invention to so provide a method of engraving a conductive layer coated over an insulating or dielectric surface that, instead of presenting depressed and steep lateral edges with sharp upper ridges, the edges of the engraved conductors are made of a smoothed and convex lines.

According to the invention, for engraving a conductive layer coated over an insulating surface, it is provided to first coat the conductive layer with a thin film of a conductive material other than the material of said layer and which can be engraved by attack of an acid solution distinct from the acid solution attacking the material of said layer; then, after coating said film with an appropriate resist mask, the engraving of the film is first ensured with an acid solution which does not appreciably attack the material of the layer and thereafter the engraving of the layer is made with an acid solution which does not appreciably attack the material of the film.

It has been found that, from such a method, the lateral edges of the engraved conductors from said layer actually present the desired smoothed and convex profile, once removed the remaining parts of resist and film.

BRIEF DESCRIPTION OF THE VIEWS OF THE DRAWINGS

Additionally to the FIGS. 1 to 3 which have been described in the above summary of the prior art.

DETAILED DESCRIPTION

In this illustrative embodiment, it is considered that, for instance, the conductive layer 2 to be engraved consists of a layer of molybdenum having for instance a thickness of the order of 3 microns and having been formed over the surface of a dielectric or insulating substrate, in such a material as alumina for instance, from cathodic sputtering of molybdenum. Over such a layer 2, a thin film or flush of nickel or another metal which is preferably electronegative with respect to molybdenum has been formed from an electrolysis operation for instance. Other conductive materials may be used provided they can be attacked with distinct acids for their respective engravings, which must be separately operated. The electrolysis operation for the formation of the flush of nickel 6 is preferably made from the use of a nickel sulfamate bath up to the obtention of a flush thickness of the order for instance of 2500 Angstroms.

A resist mask 3 is formed, from any well-known process, such as silk screen or photoresist mask process for instance, over an appropriate part of the flush 6.

Figure 5:
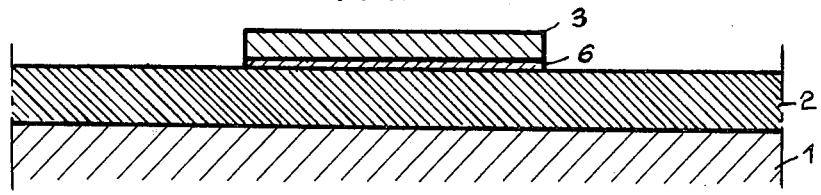
FIG. 5 shows the same assembly after an engraving operation of the film.

Engraving is then made in two steps. In the first step an acid solution is used which does not appreciably 3a molybdenum whilst being active with respect to nickel. This solution is applied until the film of nickel 6 is totally removed at any other place than that coated by the resist 3. The result of said first step is shown in FIG. 5. The acid solution which may be of advantage for this first engraving step is a solution of diluted hydrochloric acid, for instance the solution currently sold under the commercial denomination ENSTRIP 165 S.

Figure 6:
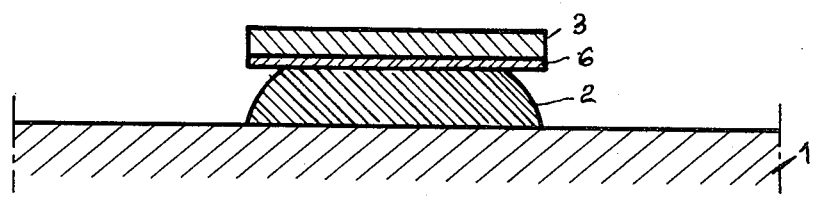
FIG. 6 shows the same assembly after an engraving operation of the layer.

The second step consists of attacking the layer of molybdenum with a solution of 50% diluted nitric acid or with a commercial solution usually sold under the denomination RC 300 SHIPLAY, either one of these solutions not appreciably attacking nickel. This second step results in such a structure as shown in FIG. 6: the edges of the molybdenum conductor do not present any sharp ridges nor steep and depressed lateral shapes but, on the other hand, said edges have proved to be smoothly convex, substantially as shown.

After the usual cleaning operation, the resist and thereafter the remaining part of the nickel flush are removed.

It is clear that the method reaches its aim, probably by surprisingly slowing the engraving of the molybdenum in the vertical direction without substantially diminishing the speed of the lateral attack thereof, and it may be estimated that such a slowing is due to some kind of passivation of the layer of molybdenum from the action of the first acid solution which ensures the engraving of the flush of nickel. Such an effect is probably reinforced from the choice of materials having electrochemical potentials which are slightly differents: for instance, the nickel is electronegative and the molybdenum is electropositive in the form coated on the insulating substrate.

Figure 1:
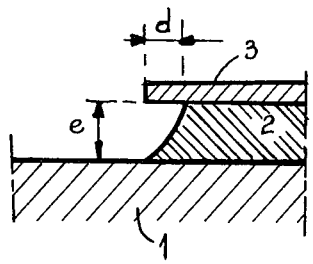
Figure 2:
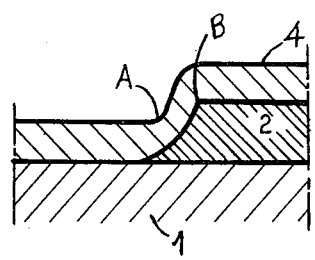
Figure 3:
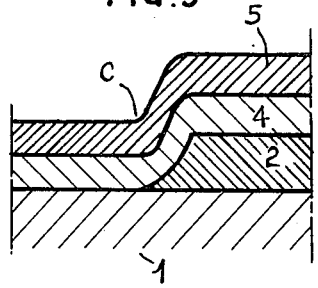
Figure 4:
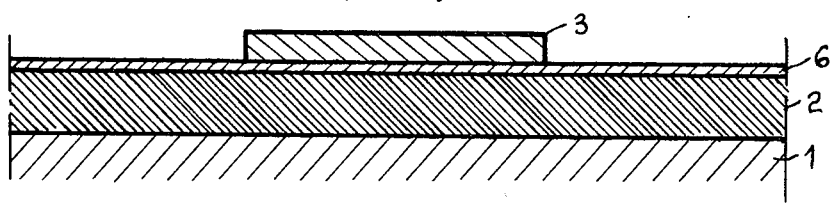
FIG. 4 shows the conductive layer 2 coated with a thin film of a conductive material distinct from its own material, a resist layer 3 being coated over the said film on a part thereof which must not be engraved.
Figure 7:
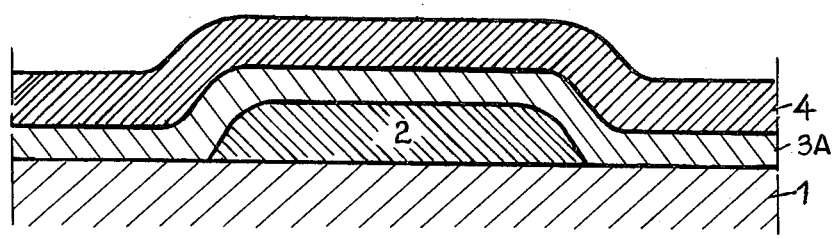
FIG. 7 shows the resulting conductor coated with a layer of dielectric material itself further coated with a second conductive layer.

FIG. 7 shows the conductor 2 as obtained from the method of the invention, coated with a dielectric layer 3A which is further coated with a second conductive layer 4. This figure is given in order to explicitate that no such defects as have been defined in relation to FIGS. 1 to 3 appear in circuits wherein the engraving is made in accordance with the above described method.

The method according to the invention will find specially advantageous application in engraving the conductive layers of multi-layer circuits, either conventional and with or without carrier substrates or more specialized as the circuits used in relation with hybrid and integrated component circuits.

What is claimed is:

1. In the manufacture of multi-layer thin film circuits made of a progressively formed stack of predetermined patterns of etched conductors, each pattern bonded to an insulating substrate, a method of making one layer of the stack comprising:
   a. providing a continuous electrically conductive layer of about 3 microns thickness bonded to an insulating substrate;
   b. depositing over said layer a continuous temporary thin flush film having a thickness of about ¼ micron and being of an electrically conductive material electronegative with respect to said layer;
   c. etching said flush through a resist mask with an acid etchant which will not etch said layer;
   d. next etching said layer through the etched portions of said flush with a different etchant which will not etch said film; and
   e. thereafter removing the remaining portions of said film whereby each conductor in the predetermined pattern of conductors exhibits a cross-sectional configuration having an upper surface substantially flat and parallel to the substrate and side surfaces which rise from the substrate in a convex curve which merges smoothly into the upper surface.

2. A method as defined by claim 1 in which the material of said layer is molybdenum deposited in its electro-positive form on said substrate and the material of said film is nickel having an electro-negative potential.

* * * * *